United States Patent
Leobandung

(10) Patent No.: US 10,141,277 B2
(45) Date of Patent: Nov. 27, 2018

(54) MONOLITHIC DECOUPLING CAPACITOR BETWEEN SOLDER BUMPS

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/475,625

(22) Filed: Mar. 31, 2017

(65) Prior Publication Data
US 2018/0286828 A1    Oct. 4, 2018

(51) Int. Cl.
| H01L 29/40 | (2006.01) |
| H01L 21/44 | (2006.01) |
| H01L 23/00 | (2006.01) |
| H01L 23/522 | (2006.01) |

(52) U.S. Cl.
CPC .......... *H01L 24/10* (2013.01); *H01L 23/5223* (2013.01); *H01L 24/26* (2013.01)

(58) Field of Classification Search
CPC ...................................................... H01L 24/10
USPC ........................... 438/605, 614; 257/736, 781
See application file for complete search history.

(56) References Cited

U.S. PATENT DOCUMENTS

| 4,862,318 | A * | 8/1989 | Galvagni ............... H01G 4/228 29/25.42 |
| 6,515,324 | B2 * | 2/2003 | Shibuya ............ H01L 23/49822 257/296 |
| 6,703,697 | B2 | 3/2004 | Leahy et al. |
| 6,859,352 | B1 * | 2/2005 | Kanasaki ................. H01G 4/35 257/E21.512 |
| 6,884,939 | B2 | 4/2005 | Dishongh et al. |
| 7,323,787 | B2 | 1/2008 | Chan |
| 7,375,429 | B2 * | 5/2008 | Teshima .................. H01L 23/50 257/737 |
| 7,738,259 | B2 | 6/2010 | Chan et al. |
| 7,791,192 | B1 * | 9/2010 | Joshi ....................... H01L 23/04 257/499 |
| 8,697,567 | B2 | 4/2014 | Henderson et al. |
| 8,806,420 | B2 | 8/2014 | Chan et al. |
| 9,263,186 | B2 * | 2/2016 | Li ............................ H01L 23/50 257/532 |
| 2009/0079074 | A1 * | 3/2009 | Motonaga ......... H01L 23/49838 257/738 |
| 2011/0090662 | A1 | 4/2011 | Jang et al. |
| 2011/0316119 | A1 | 12/2011 | Kim et al. |
| 2015/0001716 | A1 | 1/2015 | Chan et al. |

* cited by examiner

Primary Examiner — Calvin Lee
(74) Attorney, Agent, or Firm — Tutunjian & Bitetto, P.C.; L. Jeffrey Kelly

(57) ABSTRACT

An integrated circuit includes pads formed on a back end of the line surface, and decoupling capacitor stacks monolithically formed about the pads. Solder balls are formed on the pads and connect to metal layers within the decoupling capacitor stacks to reduce noise and voltage spikes between the solder balls.

19 Claims, 9 Drawing Sheets

MONOLITHIC DECOUPLING CAPACITOR BETWEEN SOLDER BUMPS

BACKGROUND

Technical Field

The present invention generally relates to semiconductor fabrication and devices, and more particularly to decoupling capacitors formed between solder bumps in chip packaging.

Description of the Related Art

Semiconductor processing often includes packaging techniques that permit connections to a chip using solder bumps and other flip chip techniques. Flip chip processing employs controlled collapse chip connections (C4), which is a method for interconnecting semiconductor devices, such as integrated circuit (IC) chips, to external circuitry (e.g., solder bumps that have been deposited onto chip pads). The solder bumps are deposited on the chip pads on a top side of the wafer during final wafer processing. To mount the chip to external circuitry (e.g., a circuit board or another chip or wafer), the chip may need to be flipped over so that the chip pads can be aligned with matching pads on the external circuit. Solder is reflowed to complete the interconnect.

The interconnects (such as solder bumps or balls) often are a source of noise and can experience voltage spikes. The noise and voltage spikes can affect information transfer and storage as well as overall device operation.

SUMMARY

In accordance with an embodiment of the present invention, an integrated circuit includes pads formed on a back end of the line surface, and decoupling capacitor stacks monolithically formed about the pads. Solder balls are formed on the pads and connect to metal layers within the decoupling capacitor stacks to reduce noise and voltage spikes between the solder balls.

A method for forming an integrated circuit includes depositing decoupling capacitor stacks monolithically on pads formed on a back end of the line surface; opening up the decoupling capacitor stacks over the pads; selectively recessing metal layers through openings over the pads; and forming solder balls on the pads and connecting to non-recessed metal layers within the decoupling capacitor stacks to reduce noise and voltage spikes between the solder balls.

Another method for forming an integrated circuit includes depositing decoupling capacitor stacks monolithically on pads formed on a back end of the line surface, the stacks including metal layers having at least two metals disposed between dielectric layers and the at least two metals being selectively etchable relative to one another; etching the decoupling capacitor stack over the pads to expose each pad through an opening, the pads including at least one supply voltage pad, at least one ground pad and at least one input/output pad; recessing first metal layers from openings over the at least one supply voltage pad and at least one input/output pad; recessing second metal layers from openings over the at least one ground pad and at least one input/output pad; and forming solder balls on the pads and connecting to non-recessed metal layers within the decoupling capacitor stacks to reduce noise and voltage spikes between the solder balls.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
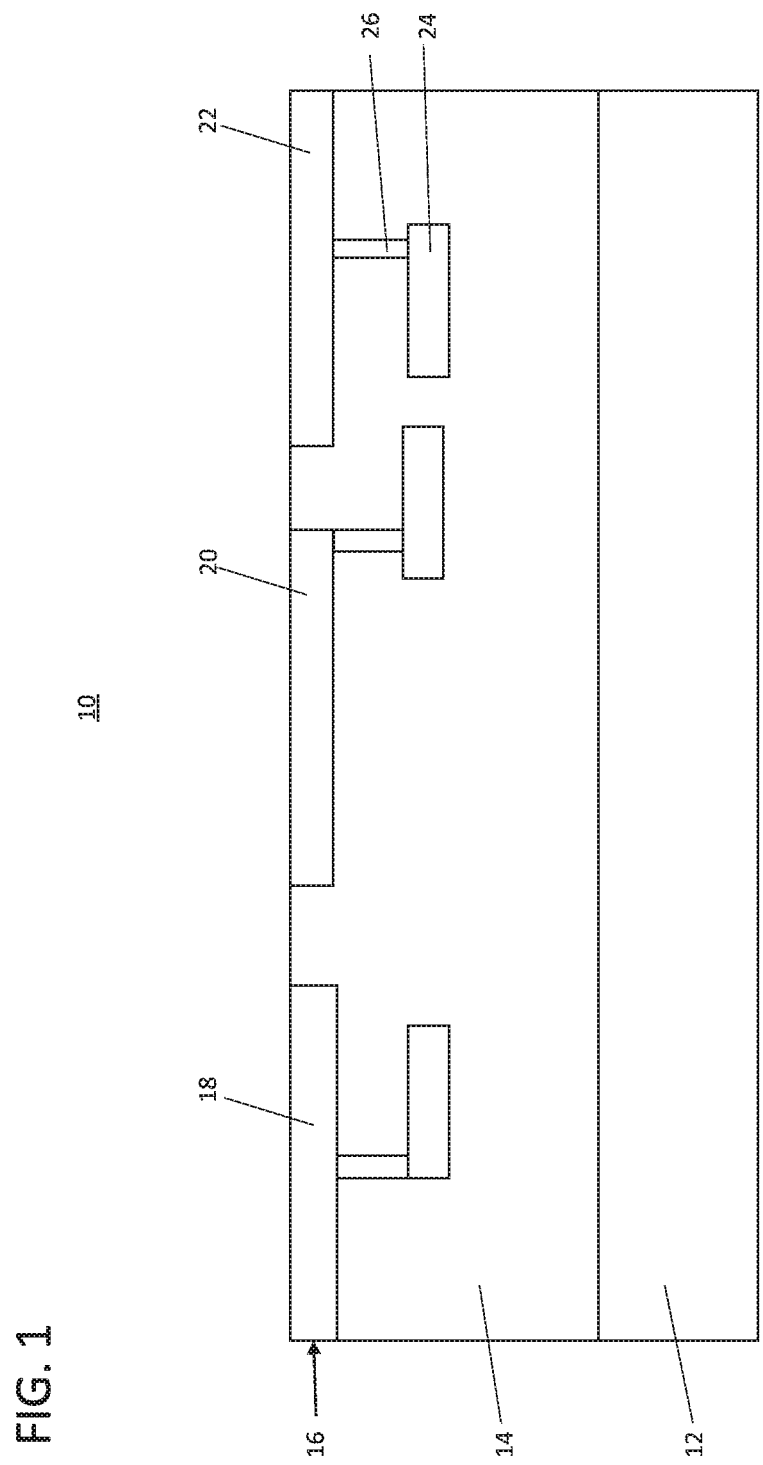
FIG. 1 is a cross-sectional view showing a back end of the line (BEOL) portion of a semiconductor device showing pads exposed in accordance with an embodiment of the present invention.

Embodiments of the present invention provide decoupling capacitors formed between solder bumps for semiconductor packaging applications. The decoupling capacitors are configured to reduce noise between certain solder bumps such as between power supply and ground. The decoupling capacitors between certain solder balls such as ground and power supply also reduce the effects of voltage spikes through the solder balls.

The decoupling capacitors are monolithically formed and provide landing areas for the solder bumps. Monolithic refers to on-chip integration of the decoupling capacitors with the underlying semiconductor device. The decoupling capacitors can include one or more metals. The metal can be recessed to prevent shorting against the solder bumps.

In particularly useful embodiments, the decoupling capacitors are formed as a stack of layers on a final back end of the line (BEOL) metal layer. The decoupling capacitors can be lithographically processed to form capacitive stacks between electrodes. The electrodes are exposed through the stack of layers by patterned etching. The decoupling capacitors, among other things, reduce noise and voltage spikes to improve device performance and reduce errors in data transfer applications.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For ample, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a portion of a semiconductor device 10 is illustratively shown. The portion of the semiconductor device 10 shown includes latest formed layers of a back end of the line (BEOL) process. A BEOL portion 14 is formed on a front end of line (FEOL) portion 12 or other structure. The FEOL portion 12 can include metal layers, dielectric layers, transistors and other devices. The BEOL portion 14 includes metal lines 24 and vias 26 that connect to pads 18, 20 and 22 in a top metal line 16. The pads 18, 20 and 22 will be assigned functions for ease of reference; however, the pads 18, 20 and 22 can be arranged in any order or functions. In one embodiment, pad 18 can include a supply voltage pad (Vdd), pad 20 can include a ground pad (Gnd), and pad 22 can include an input/output pad (I/O).

The BEOL portion 14 can be fabricated using normal process of record (POR) processing steps to provide the pads 18, 20 and 22. In other embodiments, the pads 18, 20 and 22 or other structures may be employed earlier in the process to form decoupling capacitors.

Figure 2:
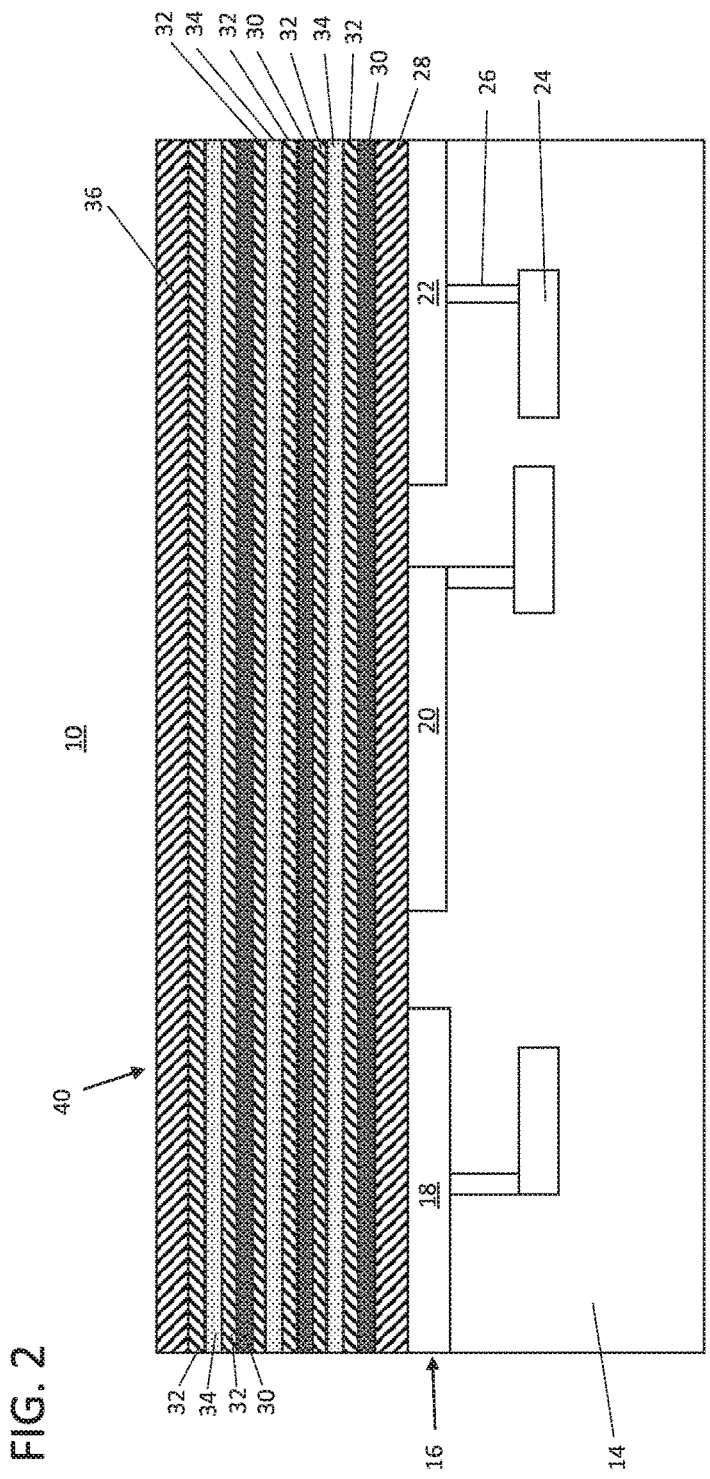
FIG. 2 is a cross-sectional view showing the back end of the line (BEOL) portion of FIG. 1 having a monolithic decoupling capacitor stack deposited over the pads in accordance with an embodiment of the present invention.

Referring to FIG. 2, a stack 40 of layers is formed on the BEOL portion 14. The stack 40 can include any number of layers. In one example, one to one hundred (or more) metal layers can be formed in the stack 40. In one illustrative embodiment, six metal layers are included, and the metal layers include dielectric layers separating the metal layers.

In illustrative embodiments, a first dielectric layer 28 is formed over the BEOL portion 14 and provides some distance between the pads 18, 20, 22 and the metal layers of the stack 40. The stack 40 includes at least two metal layers 30 and 34. The metal layers 30 and 34 include materials that can be selectively etched relative to the other. While layers 30 and 34 can be metal, any suitable conductive material can be employed. The conductive materials of layers 30 and 34 need to be selectively removable relative to each other. Conductive materials or metal layers can include metals, metal compounds, or other conductors (e.g., doped semiconductors). In some embodiments, a greater number of materials can be employed for the metal layers (e.g., more than two types of materials).

A first metal layer 30 is formed on the dielectric layer 28, followed by a second dielectric layer 32. A second metal layer 34 is formed on the next dielectric layer 32. In one embodiment, adjacent metal layers are alternated with dielectric layer 32 in between. In other embodiments, two or more metal layers can include a same metal, and the metal layers alternate in groups of two or more layers. For example, two metal layers of a first material are separated by a dielectric layer then two metal layers of a second material are separated by a dielectric layer, followed by two metal layers of the first material separated by a dielectric layer, etc. The stack pattern continues with dielectric layers 32 formed to separate adjacent metal layers 30, 34. A top dielectric layer 36 is formed on the stack 40. Metal can include a metal, a conductive metal compound (e.g., TiN, TaN), or other conductive materials (e.g., organics).

In useful embodiments, the metal layers 30 and 34 include materials that include different etch selectivities so that metal 30 can be removed selectively to metal layer 34, and metal layer 34 can be removed selectively to metal layer 30. In one example, metal layer 30 can include TiN, while metal layer 34 can include tungsten (W). The metal layers 30 and 34 can include a thickness of about 10 nm to about 100 nm, although other dimensions can be employed. The dielectric layers 28 and 36 can include a low-k dielectric material such as, e.g., SiCOH and have a thickness of between about 50 nm to about 1 micron.

The dielectric layer(s) 28, 32 and 36 can include silicon containing materials such as, e.g., $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H. Additional choices for the dielectric layers 28, 32 and 36 include any of the aforementioned materials in porous form, or in a form that changes during processing to or from being porous and/or permeable to being non-porous and/or non-permeable.

In one useful embodiment, the dielectric layers 28 and 36 include an ultra low-k dielectric material, which can include SiCOH or other suitable materials. In other embodiments, the dielectric layers 32 can include a high-k dielectric material, such as, e.g., $HfO_2$ and have a thickness of between about 1 nm to about 10 nm.

The layers of stack 40 can be formed be any suitable process including, but not limited to, chemical vapor deposition, sputtering, atomic layer deposition, evaporation, etc. The thicknesses of the layers and the amount of metal can be determined to provide decoupling capacitance when the decoupling capacitors are completed.

Figure 3:
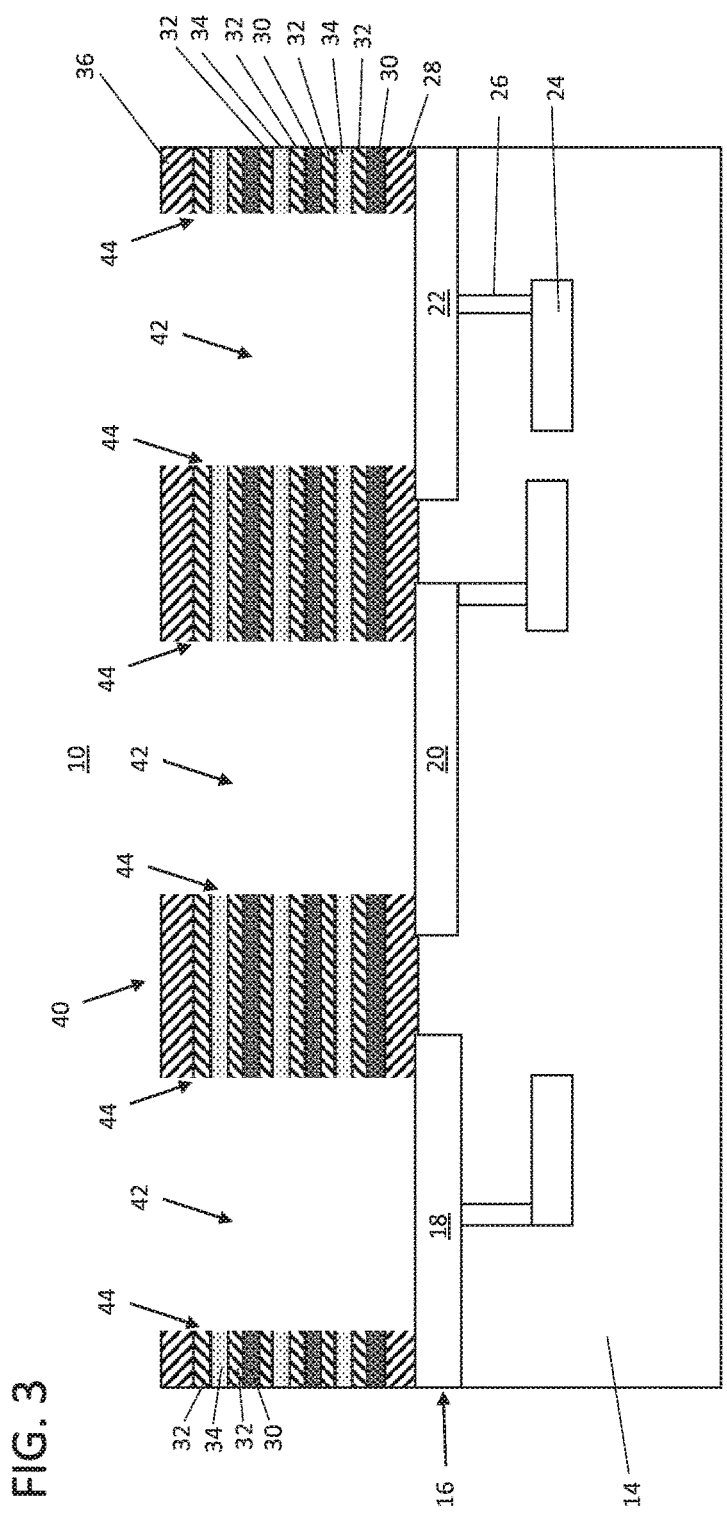
FIG. 3 is a cross-sectional view showing the back end of the line (BEOL) portion of FIG. 2 showing the monolithic decoupling capacitor stack etched to form openings over the pads in accordance with an embodiment of the present invention.

Referring to FIG. 3, openings 42 are etched into the stack 40 to expose underlying pads 18, 20, 22. The etching can include the formation of an etch mask by known methods. In one embodiment, a resist is applied, exposed in a pattern, developed to protect the remaining areas of the stack 40 and expose the areas of the stack 40 to be etched (openings 42). The etch process can include a reactive ion etch (RIE) with an etch chemistry that can penetrate the dielectric layers 28, 36, 32 and metal layers 30 and 34 stopping on the pads 18, 20, 22. The etch process exposes sidewalls 44 of the stack in regions over the pads 18, 20, 22.

Figure 4:
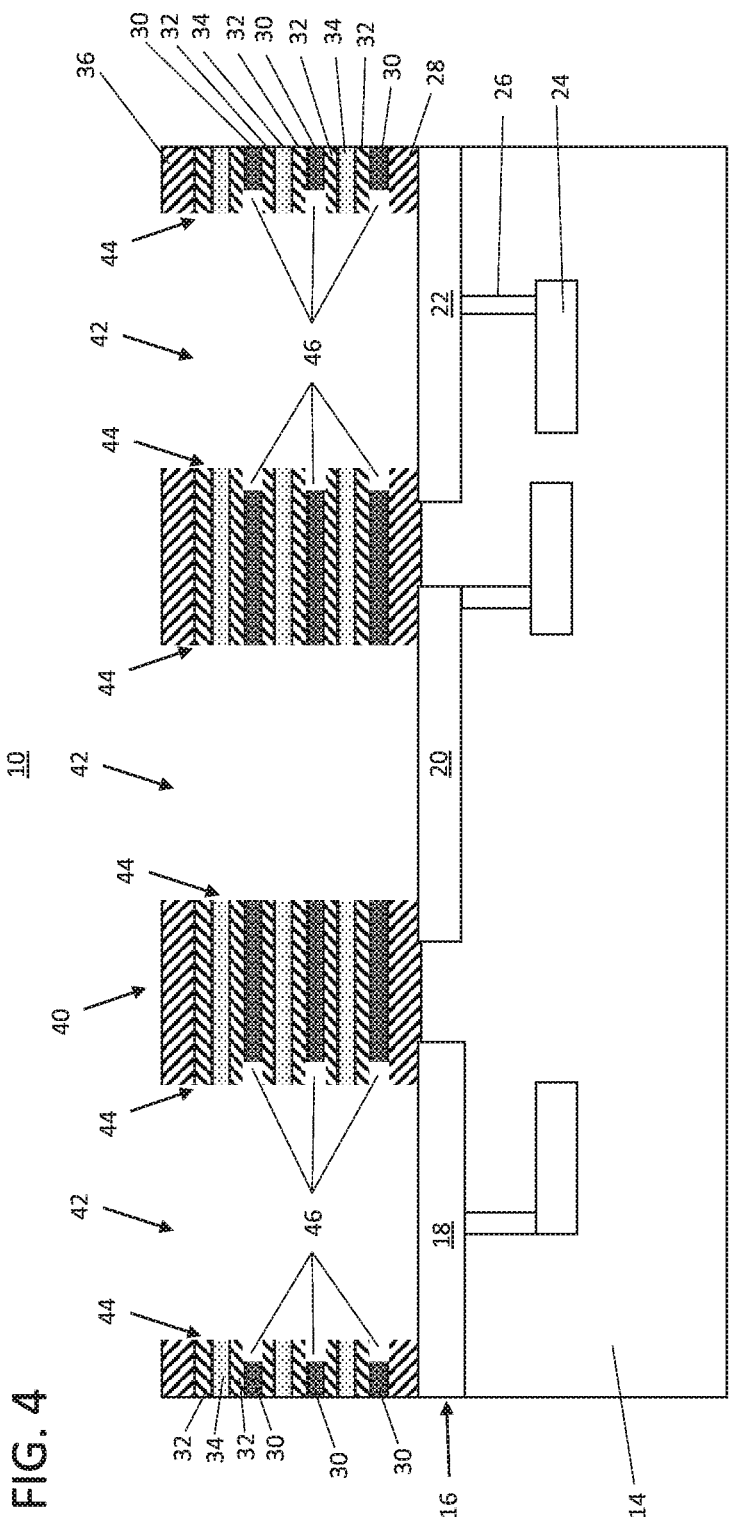
FIG. 4 is a cross-sectional view showing the back end of the line (BEOL) portion of FIG. 3 showing the monolithic decoupling capacitor stack etched to recess first metal layers from some of the openings over the pads in accordance with an embodiment of the present invention.

Referring to FIG. 4, pad 18 (Vdd) and pad 22 (I/O) are left exposed to an etch process. Pad 20 (Gnd) is blocked using a resist or other blocking material to protect the sidewalls over the pad 20 during the etching of the sidewalls 44 over pads 18 and 22. In one embodiment, a blocking material (not shown) is deposited and patterned to block the opening 42 of the Gnd pad 20 and open up the openings 42 for pad 18 (Vdd) and pad 22 (I/O). With the pad 20 (and respective sidewalls 44) blocked, an etch, such as a wet etch is performed to form recesses 46 in the first metal layers 30 away from the sidewalls 44 in the openings 42 for pad 18 (Vdd) and pad 22 (I/O). The recesses 46 are undercut sufficiently to prevent contact between each other, adjacent conductive materials or solder bumps once formed in subsequent steps.

In useful embodiments, the recesses 46 include an undercut length of between about 0.1 micron and about 5 microns. The wet etch is selective to a number of materials, e.g., the metal layers 30 are etched selectively to the metal layers 34, dielectric layers 32 and 28, 36 and pads 18 and 22. The blocking material in opening 42 of the pad 20 is then removed.

Figure 5:
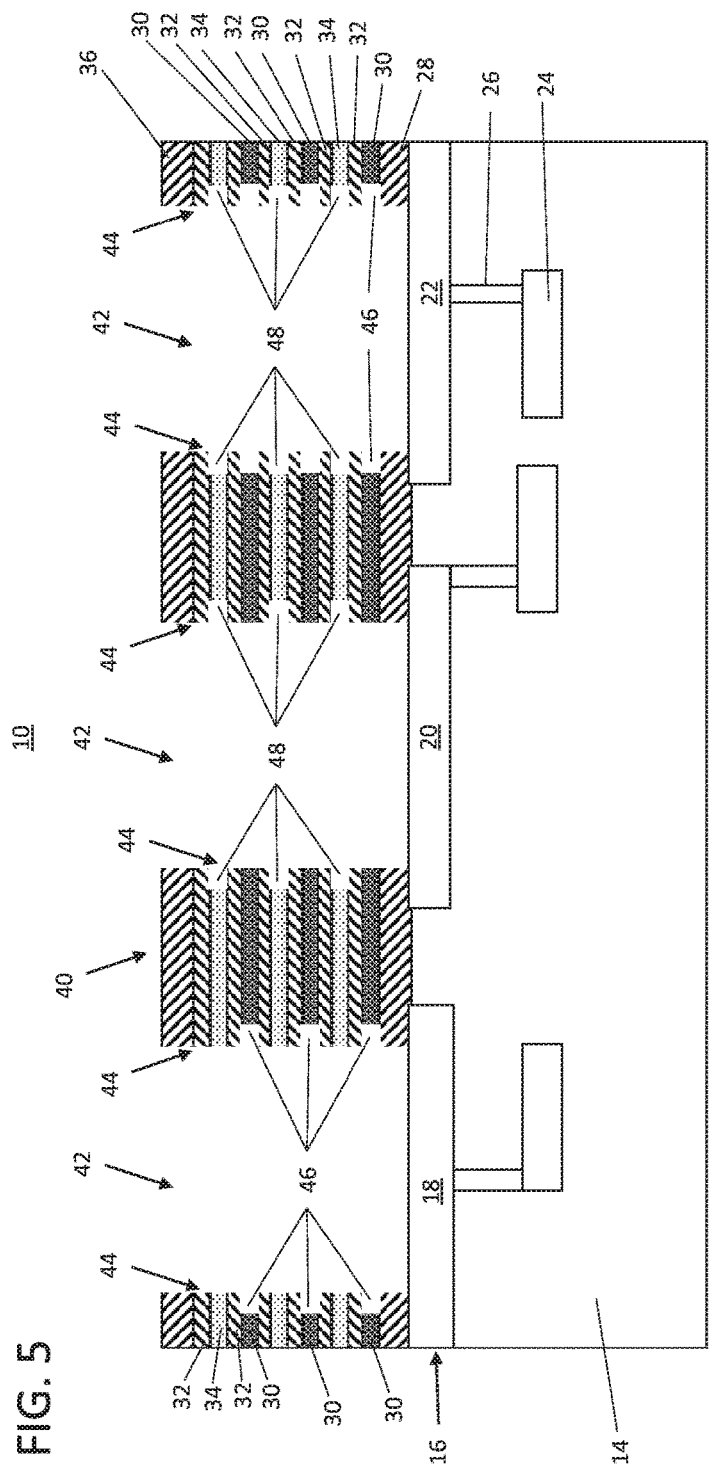
FIG. 5 is a cross-sectional view showing the back end of the line (BEOL) portion of FIG. 4 showing the monolithic decoupling capacitor stack etched to recess second metal layers from some of the openings over the pads in accordance with an embodiment of the present invention.

Referring to FIG. 5, pad 20 (Gnd) and pad 22 (I/O) are now left exposed to an etch process. Pad 18 (Vdd) is blocked using a resist or other blocking material to protect the sidewalls over the pad 18 during the etching of the sidewalls 44 over pads 20 and 22. In one embodiment, a blocking material (not shown) is deposited and patterned to block the opening 42 of the Vdd pad 18 and open up the openings 42 for pad 20 (Gnd) and pad 22 (I/O). With the pad 18 (and respective sidewalls 44) blocked, an etch, such as a wet etch is performed to form recesses 48 in the second metal layers 34 away from the sidewalls 44 in the openings 42 for pad 20 (Gnd) and pad 22 (I/O). The recesses 48 are undercut sufficiently to prevent contact between each other, adjacent conductive materials or solder bumps once formed in subsequent steps.

In useful embodiments, the recesses 48 include an undercut length of between about 0.1 micron and about 5 microns. The wet etch is selective to a number of materials, e.g., the metal layers 34 are etched selectively to the metal layers 30, dielectric layers 32 and 28, 36 and pads 20 and 22. The blocking material in opening 42 of the pad 18 is then removed.

Figure 6:
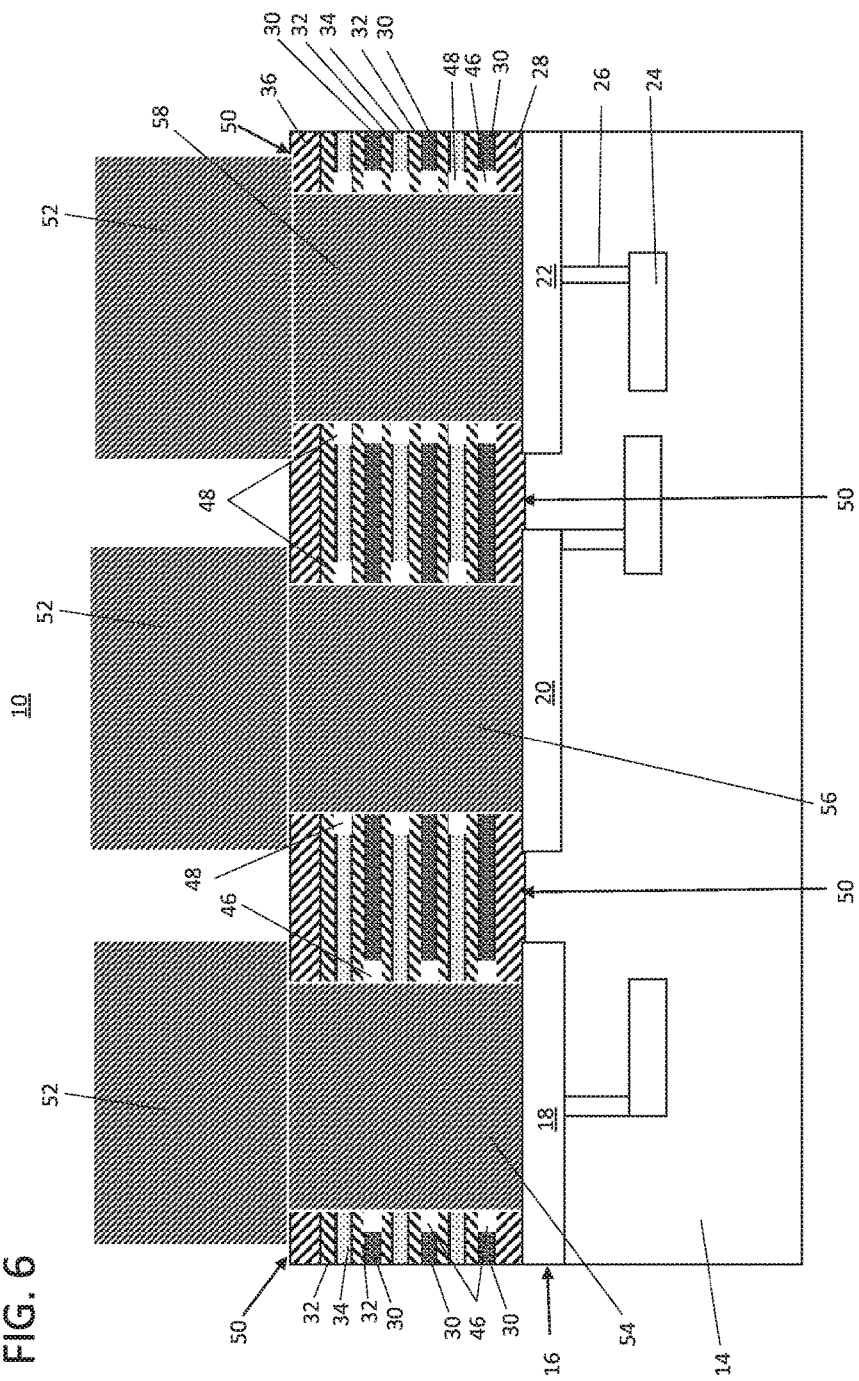
FIG. 6 is a cross-sectional view showing the back end of the line (BEOL) portion of FIG. 5 showing solder balls formed between portions of the monolithic decoupling capacitor stack and contacting non-recessed metal layers and the pads in accordance with an embodiment of the present invention.

Referring to FIG. 6, solder bumps or solder balls 52 (e.g., C4 solder balls) are formed on pads 18, 20 and 22. The solder balls 52 are self-aligned to the pads 18, 20 and 22 by decoupling capacitor stacks 50. The solder balls 52 can be deposited by an evaporation process, and in particular a shadow evaporation process. The solder balls 52 can include a lead-tin alloy although other alloys or solders can be employed. A liner can also be employed before the shadow evaporation.

The solder ball 52 on the Vdd pad 18 includes a portion 54 that connects with the second metal layers 34. The first metal layers 30 are recessed and do not contact the portion 54 of the solder ball 52. The solder ball 52 on the Gnd pad 20 includes a portion 56 that connects with the first metal layers 30. The second metal layers 34 are recessed and do not contact the portion 56 of the solder ball 52. The solder ball 52 on the I/O pad 22 includes a portion 58 that does not connect with the first metal layers 30 or the second metal layers 34 as both are recessed and do not contact the portion 58 of the solder ball 52.

The decoupling capacitor stacks 50 form horizontal plate capacitors that reduce an overall noise between Vdd and ground circuits. For example, the solder ball 52 corresponding with the Vdd pad 18 connects to one plate (e.g., second metal layers 34) of a decoupling capacitor formed by the stacks 50, and the solder ball 52 corresponding with the Gnd pad 20 connects to another plate (e.g., first metal layers 30) of a decoupling capacitor formed by the stacks 50. This increases the surface area to distribute charge and therefore reduces the noise between the Vdd pad 18 and the Gnd pad 20. The I/O pad 22 in this example, is not directly connected to the first and second metal layers 30, 34 and therefore remains electrically isolated to prevent effects on I/O data.

The recesses 46 and 48 have sufficient length to prevent short circuiting the solder balls 52. While recesses 46 and 48 can remain as air gaps, these air gaps may be filled with a dielectric material.

Figure 7:
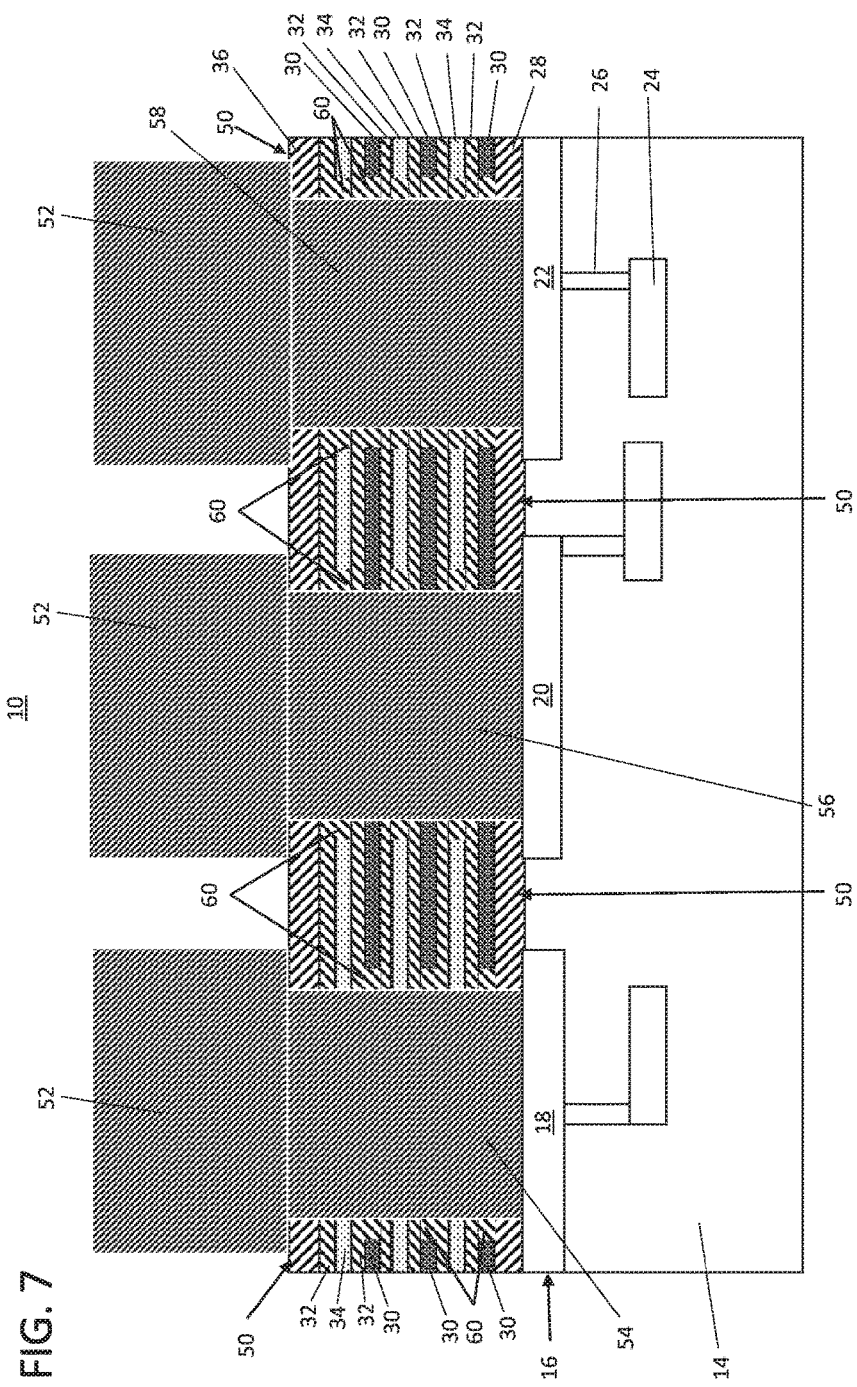
FIG. 7 is a cross-sectional view showing the back end of the line (BEOL) portion of FIG. 5 showing solder balls formed between portions of the monolithic decoupling capacitor stack and contacting non-recessed metal layers and the pads and showing recessed gaps filled with a conformally deposited and etched dielectric liner in accordance with an embodiment of the present invention.

Referring to FIG. 7, prior to formation of the solder balls 52, a dielectric liner 60 can be conformally deposited over the decoupling capacitor stacks 50 and fill or partially fill the recesses 46, 48. An etch process, such as a reactive ion etch (RIE) process can be performed. The RIE removes the dielectric liner 60 from the pads 18, 20 22 and removes excess material from the sidewalls of the openings (42). The dielectric liner 60 fills the recesses 46, 48 to ensure that adequate insulation is present to prevent shorts between metals. Then the solder balls 52 are deposited, as described.

Figure 8:
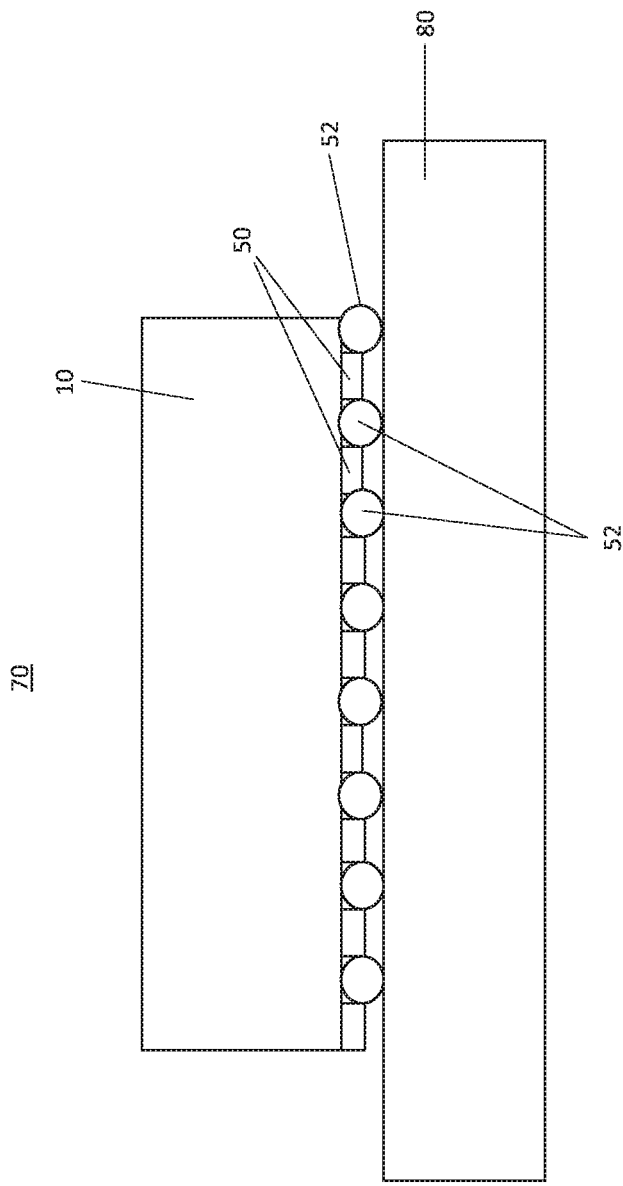
FIG. 8 is a side view showing a semiconductor device having decoupling capacitors interposed between solder balls and connected to a packaging substrate in accordance with an embodiment of the present invention.

Referring to FIG. 8, a flip chip assembly 70 is shown in accordance with one illustrative embodiment. The assembly 70 includes a chip 10 (e.g., semiconductor chip, integrated circuit) having monolithic decoupling capacitors (stacks) 50 formed thereon. The decoupling capacitors 50 have solder balls 52 formed therebetween. The solder balls 52 are selectively coupled to the stacks 50 to reduce noise and voltage spikes between the solder balls 52. The solder balls 52 are connected to a substrate 80, such as, e.g., an integrated circuit packaging substrate.

Figure 9:
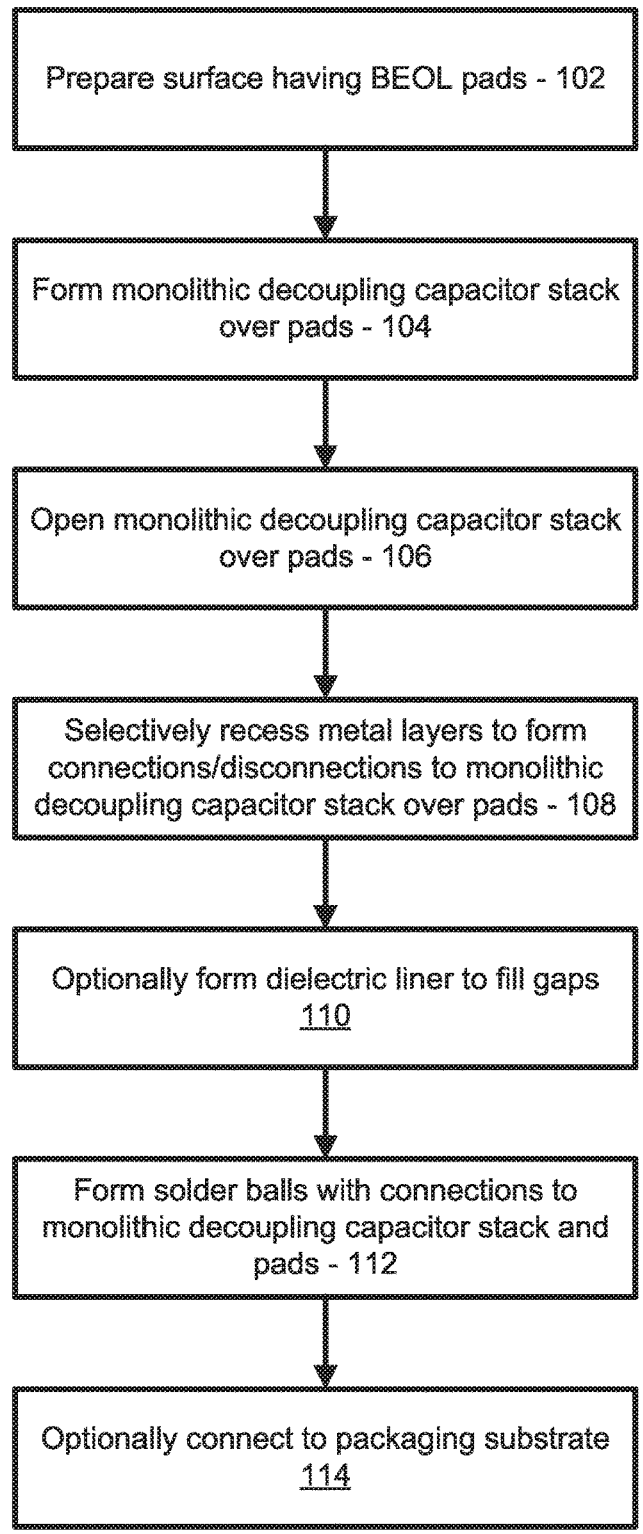
FIG. 9 is a block/flow diagram showing methods for forming an integrated circuit to reduce noise and voltage spikes in accordance with embodiments of the present invention.

Referring to FIG. 9, methods for forming an integrated circuit are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a surface is prepared to provide pads to be contacted by solder balls. In one embodiment, the pads are part of a final BEOL structure although other structures may be employed (e.g., printed wiring boards, etc.). In block 104, a decoupling capacitor stack is monolithically deposited on the pads. The decoupling capacitor stack can include dielectric layers and metal layers. The metal layers can include at least two metals disposed between the dielectric layers, and the at least two metals are preferably selectively etchable relative to one another.

In block 106, the decoupling capacitor stack is opened up over the pads by performing a patterned etch, e.g., RIE using a resist or hard mask pattern. The etch of the decoupling capacitor stack over the pads exposes each pad through the opening and exposes the ends of the metal layers in the openings as well. The pads can include at least one supply voltage pad, at least one ground pad and at least one input/output pad. Other pads or combinations of pads are also contemplated.

In block 108, the metal layers are selectively recessed through openings over the pads (to provide connections/disconnections to solder balls). The selective recessing employs the etch selectivity of the metal layers to recess certain layers. In addition, curtain openings can be blocked off using lithographic techniques to form blocking materials within the openings. The metal layers are recessed to prevent connections to solder balls to be later formed. Non-recessed metal layers will connect to the solder balls. The metal layers and the solder balls will form decoupling capacitor circuits.

In block 110, a conformal liner may be deposited and etched to fill in the gaps formed by recessing the metal layers in the decoupling capacitor stacks.

In block 112, solder balls are formed on the pads and connect to the non-recessed metal layers within the decoupling capacitor stacks to reduce capacitive coupling between the solder balls. For example, a first metal of the at least two metals is coupled to a first solder ball, and a second metal of the at least two metals is coupled to a second solder ball to form a decoupling capacitor from the first and second metals to reduce noise and voltage spikes between the first and second solder balls. The first solder ball can contact a supply voltage pad, and the second solder ball can contact a ground pad. All the metal layers can be recessed to prevent connections to a solder ball contacting a pad, e.g., an input/output pad.

In block 114, the integrated circuit (e.g., semiconductor chip or the like) can be connected or bonded to a packaging substrate, etc.

Having described preferred embodiments monolithic decoupling capacitor between solder bumps (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An integrated circuit, comprising:
   pads formed on a back end of the line surface;
   decoupling capacitor stacks monolithically formed about the pads, each decoupling capacitor stack including dielectric layers, and a first conductive layer and a second conductive layer disposed between the dielectric layers, the first and second conductive layers including respective materials having different etch selectivities;
   and solder balls formed on respective ones of the pads and connecting to respective ones of the first and second conductive layers to reduce noise and voltage spikes between the solder balls.

2. The integrated circuit as recited in claim 1, wherein the second conductive layer is coupled to a first solder ball formed on a first one of the pads and the first conductive layer is coupled to a second solder ball formed on a second one of the pads such that the first and second conductive layers form a decoupling capacitor to reduce noise and voltage spikes between the first and second solder balls.

3. The integrated circuit as recited in claim 1, wherein the first conductive layer is recessed to prevent connections to the second solder ball and the second conductive layer is recessed to prevent connections to the first solder ball.

4. The integrated circuit as recited in claim 1, wherein at least one of the conductive layers includes a material selected from the group consisting of: metal and organic.

5. The integrated circuit as recited in claim 1, wherein the decoupling capacitor stacks include up to 100 conductive layers.

6. The integrated circuit as recited in claim 1, wherein the first conductive layer includes titanium nitride (TiN) and the second conductive layer includes tungsten (W).

7. The integrated circuit as recited in claim 1, wherein the first pad is a supply voltage pad and the second pad is a ground pad.

8. The integrated circuit as recited in claim 7, wherein the first and second conductive layers are recessed to prevent connections to a third solder ball contacting an input/output pad.

9. The integrated circuit as recited in claim 1, wherein the dielectric layers include a first dielectric layer and a second dielectric layer, wherein the first conductive layer is formed on the first dielectric layer, the second dielectric layer is formed on the first conductive layer, and the second conductive layer is formed on the second dielectric layer.

10. The integrated circuit as recited in claim 9, wherein the first dielectric layer includes a low-k dielectric material and the second dielectric layer includes a high-k dielectric material.

11. The integrated circuit as recited in claim 9, wherein the dielectric layers further include a third dielectric layer formed as a final layer of each decoupling capacitor stack.

12. The integrated circuit as recited in claim 11, wherein the third dielectric layer includes a low-k dielectric material.

13. An integrated circuit, comprising:
    a supply voltage pad and a ground pad formed on a back end of the line surface;
    a first solder ball contacting the supply voltage pad and a second solder ball contacting the ground pad; and
    decoupling capacitor stacks monolithically formed about the pads, each decoupling capacitor stack including dielectric layers, and first and second conductive layers disposed between the dielectric layer, the first and second conductive layers including respective materials having different etch selectivities, wherein the first conductive layer is coupled to the second solder ball, and the second conductive layer is coupled to the first solder ball such that the first and second conductive layers form a decoupling capacitor to reduce noise and voltage spikes between the first and second solder balls.

14. The integrated circuit as recited in claim 13, wherein the dielectric layers include a first dielectric layer including a low-k dielectric material and a second dielectric layer including a high-k dielectric material, wherein the first conductive layer is formed on the first dielectric layer, the second dielectric layer is formed on the first conductive layer, and the second conductive layer is formed on the second dielectric layer.

15. The integrated circuit as recited in claim 13, wherein the first and second conductive layers are recessed to prevent connections to a third solder ball contacting an input/output pad formed on the back end of the line surface.

16. The integrated circuit as recited in claim 14, wherein the dielectric layers further include a third dielectric layer including a low-k dielectric material formed as a final layer of each decoupling capacitor stack.

17. The integrated circuit as recited in claim 13, wherein the first conductive layer is recessed to prevent connections to the second solder ball, and the second conductive layer is recessed to prevent connections to the first solder ball.

18. The integrated circuit as recited in claim 13, wherein the first conductive layer includes titanium nitride (TiN) and the second conductive layer includes tungsten (W).

19. The integrated circuit as recited in claim 13, wherein the decoupling capacitor stacks include up to 100 conductive layers.

\* \* \* \* \*